United States Patent [19]
Hara

[11] Patent Number: 5,498,902
[45] Date of Patent: Mar. 12, 1996

[54] SEMICONDUCTOR DEVICE AND ITS MANUFACTURING METHOD

[75] Inventor: Akitoshi Hara, Suwa, Japan

[73] Assignee: Seiko Epson Corporation, Japan

[21] Appl. No.: 296,055

[22] Filed: Aug. 24, 1994

[30] Foreign Application Priority Data

Aug. 25, 1993 [JP] Japan ................................. 5-210696
Jun. 27, 1994 [JP] Japan ................................. 6-165840

[51] Int. Cl.[6] ........................... H01L 23/02; H01L 23/495
[52] U.S. Cl. ........................... 257/686; 257/685; 257/666
[58] Field of Search .................... 257/685, 686, 257/723, 724, 666, 676, 674, 669, 668; 361/735, 813, 820; 174/52.1, 52.4

[56] References Cited

U.S. PATENT DOCUMENTS 5,376,825  12/1994  Tukamoto et al. ................. 257/685

FOREIGN PATENT DOCUMENTS 60-147142  8/1985  Japan ................................. 257/686
3-250757  11/1991  Japan ................................. 257/686
4-58553  7/1992  Japan ................................. 257/685

Primary Examiner—Edward Wojciechowicz
Assistant Examiner—S. V. Clark

[57] ABSTRACT

In a semiconductor device is provided a semiconductor element 22 encapsulated in a package 26. The connection area 29 used to connect an external structure, such as a heat-dissipating plate 30 or another semiconductor device, is installed in either the die pad 23 used for mounting the semiconductor element or inner leads 24 that are electrically connected to the semiconductor element. The connection area is integrated with the external structure via linking holes 28 that have been formed in the package. By combining a packaged and completed semiconductor device with various types of external structures, it becomes possible to expand or enhance the function of the overall semiconductor device, or to lower its cost.

12 Claims, 6 Drawing Sheets

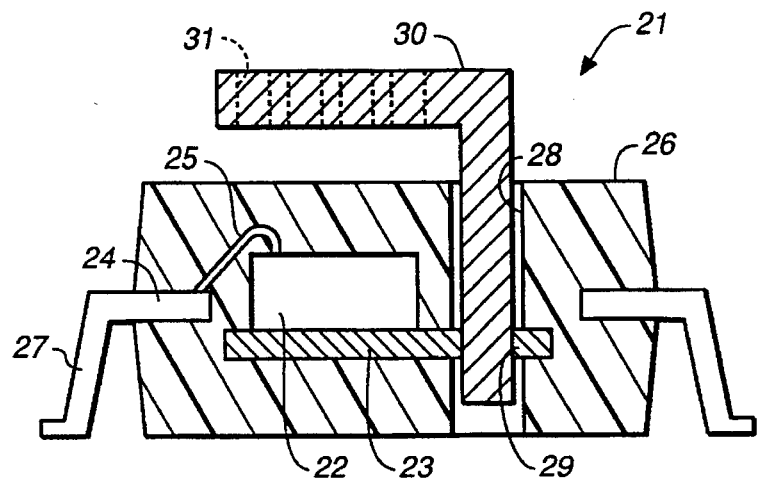
FIG._1
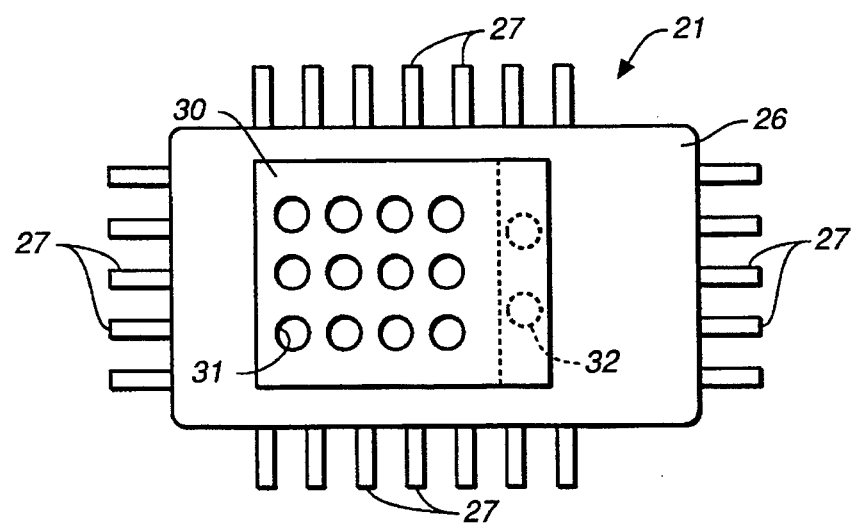
FIG._2
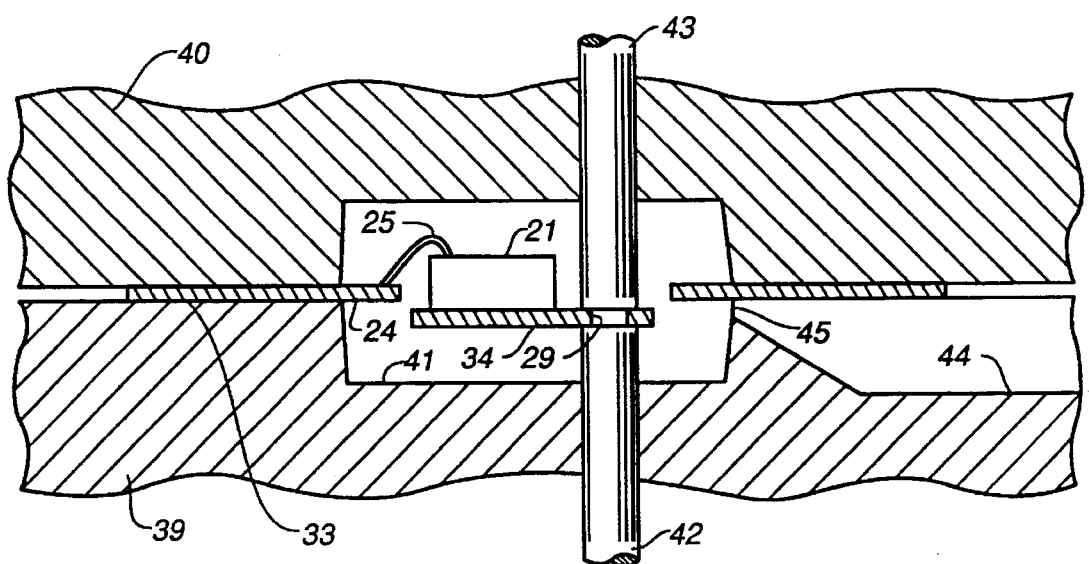
FIG._4

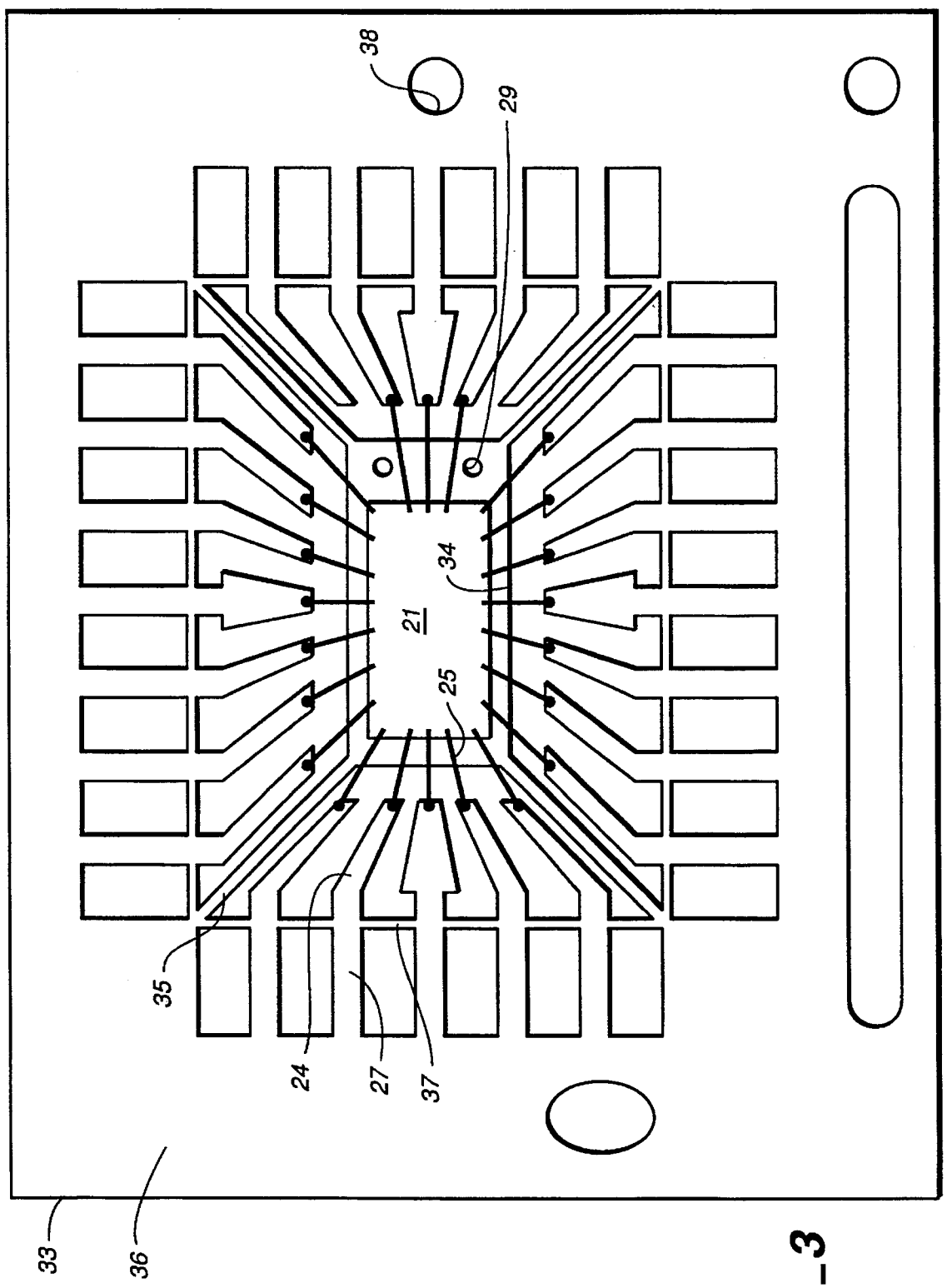
FIG._3

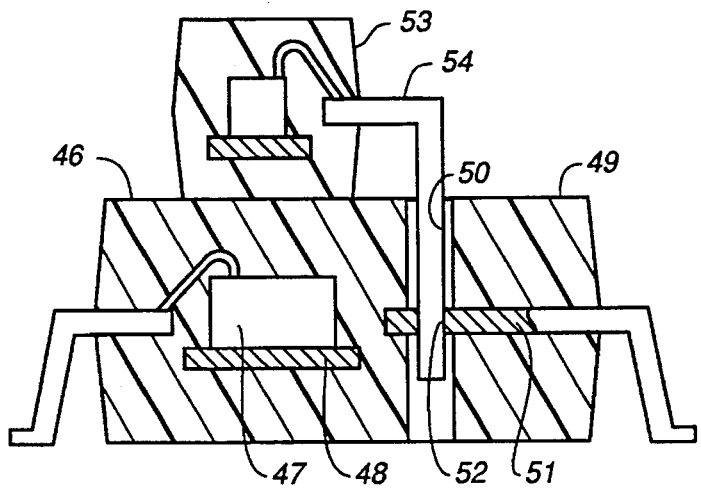
FIG._5
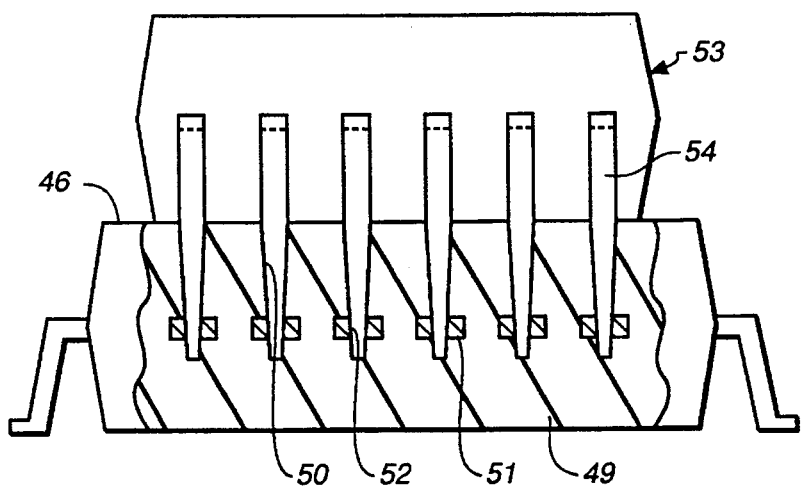
FIG._6
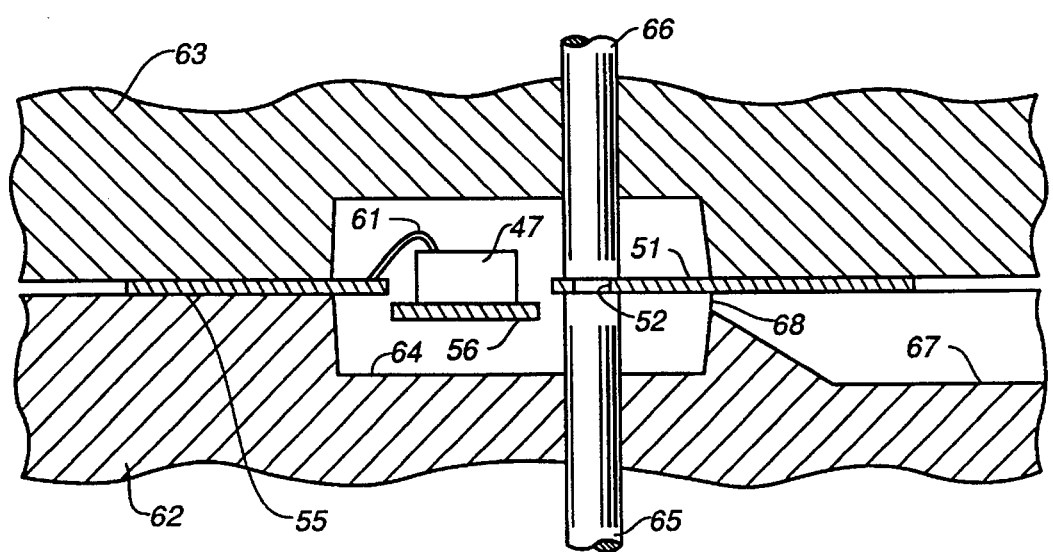
FIG._8

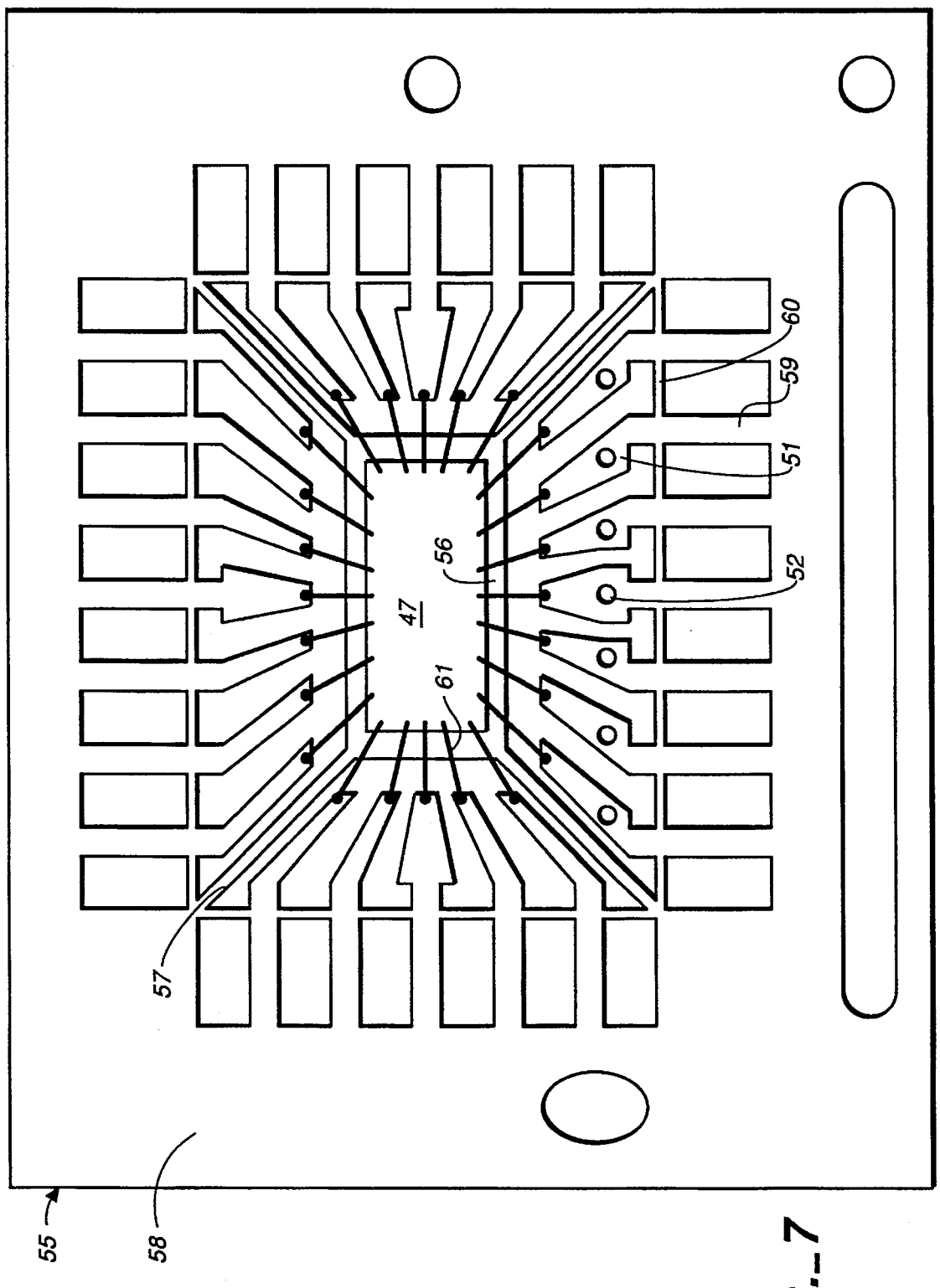
FIG._7

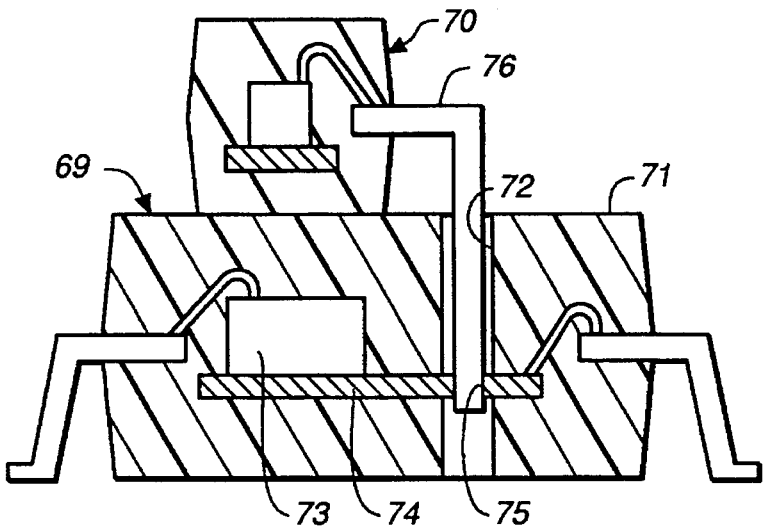
FIG._9
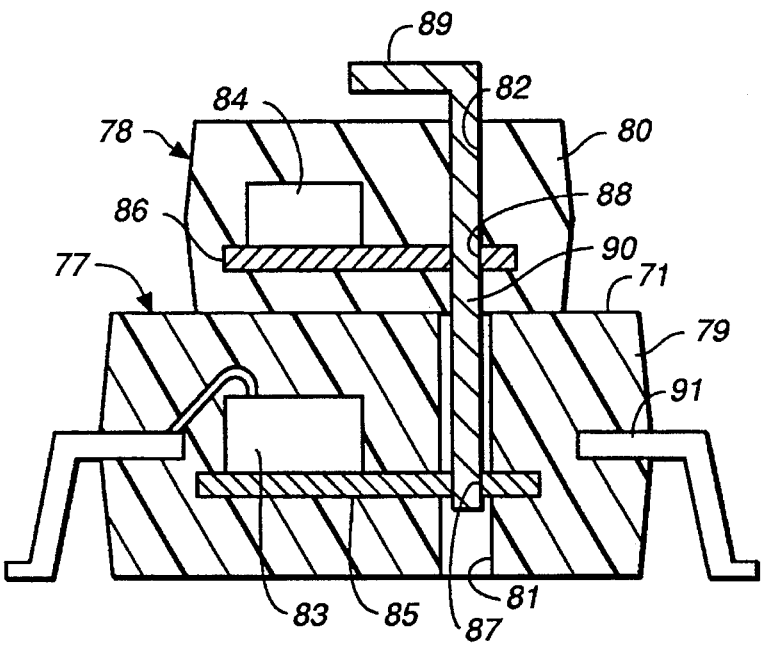
FIG._10
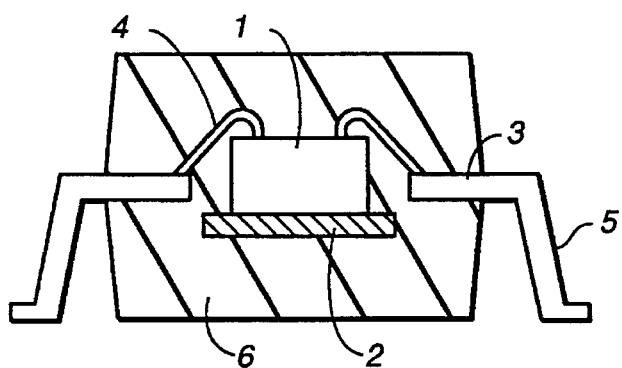
FIG._11

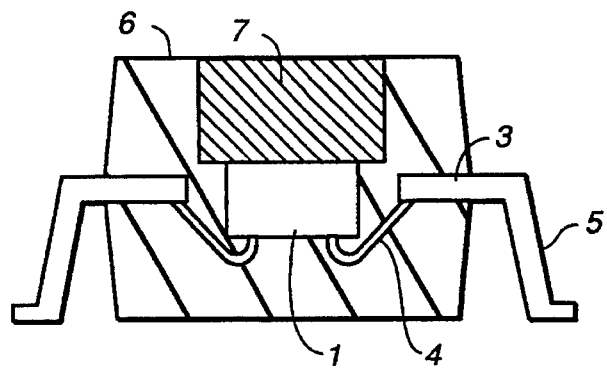
FIG._12
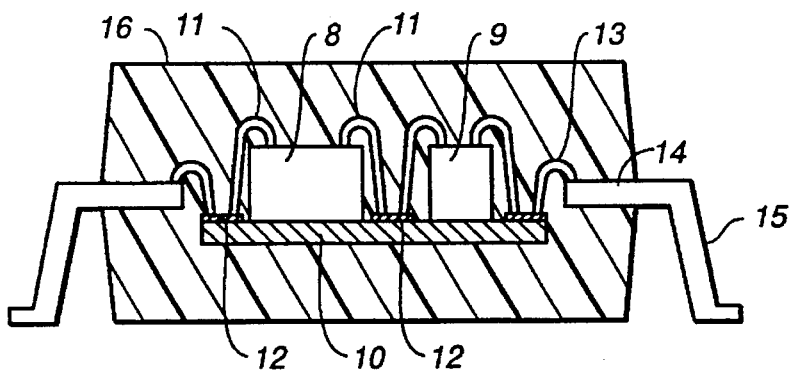
FIG._13
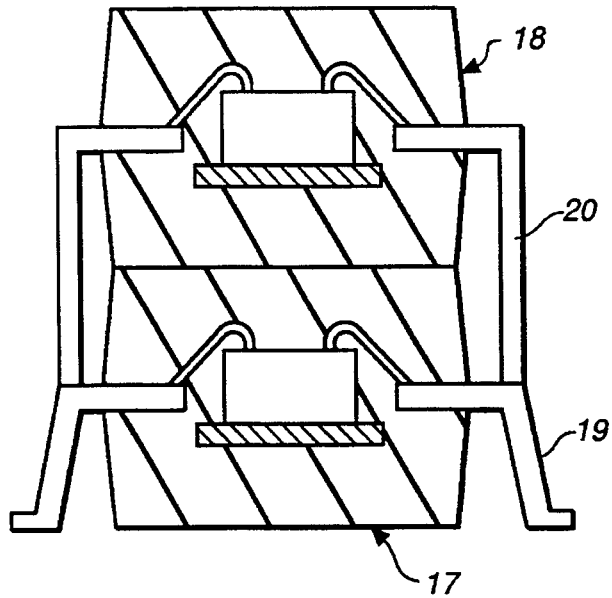
FIG._14

SEMICONDUCTOR DEVICE AND ITS MANUFACTURING METHOD

BACKGROUND OF THE INVENTION

This invention relates generally to a semiconductor deuce possessing a package structure which encapsulates a semiconductor element, and to a method of manufacturing thereof. More particularly, to the semiconductor deuces having improved heat dissipation characteristics

Field of the Invention

Traditionally, packaging of semiconductor devices have been used in order to protect semiconductor elements against the environment, such as, shock, moisture, impurities, etc.. Additionally, such packaging may also be employed to seal the semiconductor devices in a particular atmosphere. Ordinarily, resins, ceramics, and metals can be used for packaging materials to encapsulate semiconductor elements.

FIG. 11 shows a general configuration of a packaged semiconductor device. In this semiconductor device, a single semiconductor element 1 is bonded onto a mounting pad 2 which consists, for example, of a die pad in which its electrodes and inner leads 3 are electrically connected using wiring 4. Semiconductor element 1 connected in this way is encapsulated inside a plastic package 6 with its outer leads 5, which are the extension of the inner leads 3, exposed to the outside. The outer leads 5 are formed into the proper shape and solder plating is applied to their surface so that they can be easily connected to a circuit board in actual applications. Normally, ink, or laser, etc. are used to mark the product name, model number, characteristics, etc. of the semiconductor device on the surface of the plastic package 6.

Furthermore, as semiconductor elements have recently come to operate faster and are constructed having a higher density, these semiconductor elements produce much more heat than before. It is, therefore, necessary to effectively dissipate this heat to improve the reliability of these semiconductor devices. One such method is to use semiconductor devices in packages which themselves possess a heat-dissipating structure. For example, FIG. 12 shows the structure of a conventional semiconductor device possessing a heat-dissipating function. In this example, a heat-conducting adhesive, such as silver solder, is used to securely attach and maintain thermal metallic heat dissipater 7 to semiconductor element 1. As shown therein, the element is mounted upside down. Semiconductor element 1 and inner leads 3, which are electrically connected via wire 4, are encapsulated inside the plastic package 6, while the top surface of heat dissipater 7 is exposed to the outside.

Semiconductor devices in which multiple semiconductor elements have been packaged together are also being used, in order to increase the performance and density of the semiconductor elements. In the conventional semiconductor device shown in FIG. 13, two semiconductor elements 8 and 9 are mounted on a common substrate 10, which consists, for example, of an organic material, and are each connected to wiring 12 on substrate 10 via wire 11. Wiring 12 is then connected to inner leads 14 via wiring 13, and all of these elements are encapsulated inside plastic package 16 with outer leads 15 exposed to the outside.

FIG. 14 shows a semiconductor device possessing another type of conventional structure in which multiple semiconductor elements have been combined. In this semiconductor device, one semiconductor device 18 possessing a package structure containing a single semiconductor element, such as the one shown in FIG. 11, is stacked on top of another identical semiconductor device 17, forming a single unit. The outer leads 19 of semiconductor device 17 on the bottom are electrically connected through, for example, soldering to the corresponding outer leads 20 of the semiconductor device 18 on the top.

As explained above, as the performance and speed of semiconductor devices have been enhanced, semiconductor elements have begun to generate a large amount of heat, and proper dissipation of this heat has become a very important issue. For example, the heat generated by the semiconductor element itself may cause brittleness in the eutectic metal comprising the connection between the element's electrode and the wiring, causing an open circuit inside the package. Furthermore, because the epoxy thermosetting resins that comprise the plastic package are low in heat conductivity, it is relatively difficult to effectively dissipate the internally generated heat to the outside environment. When the temperature of the whole semiconductor device rises as a result, the adhesion between the encapsulating resin, that comprises the package, and the semiconductor element, and the adhesion between the resin and the inner lead is significantly reduced. This can produce, among other defects, a gap therebetween. Consequently, moisture can enter from outside, contaminating the semiconductor element itself. Additionally, the high temperature may cause this moisture to expand or even create steam inside the package, thus, causing it to crack. Both of these features result in significant shortening of the life of the semiconductor device. Additionally, if the contained semiconductor element is used in an environment that exceeds the rated temperature range, deterioration in operating speed or malfunction may even result. This situation may likely cause the semiconductor element to be destroyed.

To avoid these problems, various methods have been used, such as forced cooling of the semiconductor element through use of a fan or coolant, and heat dissipation using fins or heat sinks. However, since these cooling methods are relatively expensive, raise costs, and enlarge the overall size of the device, they cannot be used in applications that require small size and high packaging density. Although the semiconductor device possessing the heat-dissipating structure shown in FIG. 12 possesses sufficient heat-dissipating characteristics, its manufacturing is complicated and consequently results in relatively high cost. Furthermore, because the heat dissipater is heavy, the use of a cushioning material becomes necessary in order to prevent deformation of plastic package 6, thus resulting in a complicated and more costly structure. Additionally, because the semiconductor element is mounted in an upside down arrangement, opposite to the normal pin arrangement, the pin assignment must be reversed when packaging the semiconductor device, thus increasing the risk of causing confusion in assembly or design.

As the performance and speed of electronic equipment continue to be enhanced, the use of compound semiconductor devices, each of which contains multiple semiconductor elements, is increasing. At the same time, requirements for small-size and high-density packaging of semiconductor devices are also increasing, in order to achieve miniaturization of electronic equipment. However, because multiple semiconductor elements are placed on the same plane in conventional semiconductor devices, such as that shown in FIG. 13, the circuit board 10 increases in size and area. Consequently, the overall semiconductor device increases in size and packaging area, increasing the difficulty of attaining a compact size. As this occurs, the magnitude of warpage and twisting in the semiconductor device also increases. In particular, a risk exists that accuracy will deteriorate in the assembly of the semiconductor device onto the circuit board as lead pitch becomes narrower and packaging density increases. Furthermore, even after assembly onto the circuit board is finished, there is still a risk, in the case of a two-directional pin arrangement such as that used for memory chips in particular, that the differing coefficients of thermal expansion in the circuit board materials or structure will break or crack the joint between the leads of the semiconductor device and the surface area of the circuit board, thus rendering the entire circuit board unusable. To package multiple semiconductor elements without increasing the overall size of the semiconductor device, the connection of the semiconductor device must be made finer, which will require even more advanced technology.

Furthermore, in structures in which multiple semiconductor elements are stacked, such as that shown in FIG. 14, outer leads 19 and 20 are soldered together. Consequently, as the lead pitch becomes narrower, positioning of the two leads for connection requires greater accuracy, as such, it becomes more difficult. Additionally, it is difficult to remove or replace either of the two semiconductor devices, should one of them fail after the connection is made.

Furthermore, in semiconductor device manufacturing processes, the electrical performance of each semiconductor element is tested on the wafer before dicing, and only those products passing the test are packaged. However, failures could occur during packaging or assembly into semiconductor devices. Consequently, the yield of semiconductor devices that contain multiple semiconductor elements becomes very small. The yields of the combined semiconductors is calculated by multiplying the yields of the individual semiconductor elements. For example, if the yield of each semiconductor element is 90%, the yield of a semiconductor device that contains three such semiconductor elements is 90%×90%×90%=72.9%, which is approximately 20% lower than that of an individual unit.

Objects of the Invention

It is an object of the present invention to provide a semiconductor device that obviates to the aforementioned problems of conventional semiconductor devices.

It is a further object of the present invention to provide a multi-chip configured semiconductor device which can be manufactured relatively simply and inexpensively utilizing conventional technologies.

It is another object of the present invention to provide a semiconductor device which can effectively dissipate heat generated therein.

It is a further object of the present invention to provide a method of manufacturing the aforementioned semiconductor device.

Other objects and advantages of the present invention will be apparent to those of ordinary skill in the art from a consideration of the following detailed description taken in conjunction with the next drawings. However, we can prosecute those claims in the continuation.

Summary of the Invention

In accordance with an aspect of the present invention, a semiconductor device consists of at least one semiconductor element that is placed on a semiconductor element mounting area, inner and outer leads that are electrically connected to the semiconductor element, and a package that encapsulates the semiconductor element and the inner leads connected to it. The semiconductor element mounting area, on which the semiconductor element is mounted, is equipped with a connection area for connecting an exterior structure, and the package is equipped with linking holes that lead from the package surface to the connection area of the semiconductor element mounting area. In such a semiconductor device it is possible to connect and integrate an external structure, as necessary, to the semiconductor element mounting area of the semiconductor device through the linking holes of the package, after the package structure has been completed; thus making it easy to expand the function of the semiconductor device by adding the function of the external structure.

In accordance with another aspect of the present invention, a semiconductor device is provided having connection area comprising through-holes formed in the part of the semiconductor element mounting area that is located inside the linking holes of the package. The external structure connected to the connection area of the semiconductor element mounting area consists of, for example, a heat-dissipating device.

With the semiconductor device constructed in this fashion, it is possible to easily form a connection area simply by forming through-holes in the specified locations of the semiconductor device mounting area, and it is also possible to integrate an external structure by press-fitting the joining area of the external structure into the through-holes.

Moreover, it is possible to simply add a heat-dissipating fiction. By connecting a heat-dissipating device, such as a heat-dissipating plate, to the connection area of the semiconductor element mounting area through the linking holes in the package in a manner that allows heat transfer, the heat generated by the semiconductor element is transferred to the external heat-dissipating plate via the semiconductor element mounting area.

In accordance with an additional aspect of the present invention, one semiconductor element is placed on the semiconductor element mounting area, such that inner and outer leads are electrically connected to the semiconductor element, and a package encapsulates the semiconductor element and the inner leads. The inner leads are equipped with connection areas that can be connected to an exterior structure, and the package is equipped with linking holes that lead from the package surface to the inner lead connection areas. The inner leads include through-holes formed in the part of the inner leads that are located inside the linking-hole of the package. Thus it is possible to expand the functions of the semiconductor device by adding the functions of an external structure by directly joining the external structure to the connection area of the inner leads through the linking holes of the package after the package structure has been completed, thus easily forming an integrated structure.

Furthermore, it is possible to easily form an integrated structure by press-fitting the joining area of the external structure into the through-holes in the connection area of the inner leads.

In accordance with still a further aspect of the present invention, a compound-type semiconductor device is provided consisting of multiple semiconductor elements in which the inner leads are connected to the semiconductor element via a wiring from a connection area to the outside. The device comprises a first semiconductor device having a package equipped with linking holes that lead from the package surface to the inner lead connection area, and a second semiconductor device which possesses outer leads that extend to the outside of the package which encapsulates the semiconductor element. The outer leads of the second semiconductor device are connected to the inner lead connection area of the first semiconductor device, via the package linking holes. Accordingly, it is possible to expand or enhance the function of the semiconductor device, as required by the application, thus obtaining a functionally compound semiconductor device, by combining two semiconductor devices in completed packages in various ways, and by electrically and mechanically connecting the outer leads of the second semiconductor device to the inner lead connection area of the first semiconductor device. It is also possible to replace one of the two devices or change the combination.

In accordance with still another aspect of the present invention, a process of manufacturing such a semiconductor device described above includes a process in which the semiconductor device mounting area on which a semiconductor element has been mounted, is held inside the resin formation mold from the top and the bottom using a pair of movable pins in the connection area of the semiconductor device. A resin is then injected while the semiconductor device is held in the spedfied position by the above-mentioned method, and the movable pins are removed after the resin hardens. Furthermore, it is possible, using conventional technology, to accurately position both the semiconductor element mounting area and the semiconductor element within the package. At the same time, it is possible to form in the package, linking holes that reach the connection area in the semiconductor element mounting area after the movable pins are removed, by injecting and hardening a resin while the semiconductor element mounting area in which the semiconductor element has been mounted is held inside the mold, at its connection area, from the top and bottom by a pair of movable pins.

In accordance with still an additional aspect of the present invention, a process of manufacturing the afore-described semiconductor device through resin encapsulation, includes a process in which the inner leads that are electrically connected to the semiconductor element, are held inside the resin formation mold from the top and the bottom using a pair of movable pins in the connection area of the inner lead. A resin is then injected while the semiconductor device is held in the specified position by the above-mentioned method, and the movable pins are removed after the resin hardens. Furthermore, it is possible, using conventional technology, to accurately position both the semiconductor element mounting area and the semiconductor element within the package. At the same time, it is possible to form in the package, linking holes that reach the connection area in the semiconductor element mounting area after the movable pins are removed, by injecting and hardening a resin while the semiconductor element mounting area in which the semiconductor element has been mounted is held inside the mold, at its connection area, from the top and bottom by a pair of movable pins.

Other objects and attainments together with a fuller understanding of the invention will become apparent and appreciated by referring to the following description and claims taken in conjunction with the accompanying drawings.

BRIEF DESCRIPTION OF THE DRAWINGS

In the drawings, wherein like numerals represent like parts:

FIG. 1 is a cross-sectional view of a semiconductor device according to the first embodiment of the present invention;

FIG. 2 is a plan view of the first embodiment shown in FIG. 1;

FIG. 3 is a top view of a lead frame used in the manufacture of the semiconductor device in accordance with the first embodiment;

FIG. 4 is a cross-sectional view showing the process of resin encapsulation of the semiconductor device in accordance with the first embodiment;

FIG. 5 is a cross-sectional view showing the semiconductor device in accordance with the second embodiment of the present invention;

FIG. 6 is a partial cross-sectional view of the second embodiment shown in FIG. 5;

FIG. 7 is the top view of a lead frame used in the manufacture of the semiconductor device in accordance with the second embodiment;

FIG. 8 is cross-sectional view showing the resin encapsulation process used for the manufacture of the semiconductor device in accordance with the second embodiment;

FIG. 9 is a cross-sectional view showing a modified embodiment of the semiconductor device of the present invention;

FIG. 10 is a cross-sectional view showing yet another modified embodiment of the semiconductor device of the present invention;

FIG. 11 is a cross-sectional view showing a conventionally-structured semiconductor device comprising a resin package in which a single semiconductor element has been mounted;

FIG. 12 is a cross-sectional view showing a conventionally-structured semiconductor device comprising a resin package having a heat-dissipating device;

FIG. 13 is a cross-sectional view showing a conventional semiconductor device that consists of a resin package in which multiple semiconductor elements have been mounted; and FIG. 14 is a cross-sectional view showing a different working example of a conventional semiconductor device with a package structure in which multiple semiconductor elements have been mounted.

DETAILED DESCRIPTION OF THE PREFERRED EMBODIMENTS

First Embodiment

FIG. 1 illustrates a semiconductor device 21 comprising a single semiconductor element 22 disposed on die pad 23. In this arrangement, electrodes of the device and corresponding inner leads 24 are electrically connected via wiring 25. Both semiconductor element 22 mounted on die pad 23 and inner leads 24 are encapsulated with an encapsulation material inside the plastic package 26. The encapsulation material preferably consists of resin material, although those of ordinary skills in the art will recognize that other suitable material may be employed. Outer leads 27, which are the extension of the inner leads 24, protrude outward from the four sides of the roughly rectangular package, as shown in detail in FIG. 2. Linking holes 28, which pass through the plastic package 26 in the vertical direction, have been formed in the plastic package 26, and die pad 23 traverses the holes. Connection holes 29 are formed in that area of die pad 23 which is exposed to the linking holes 28.

Referring again to FIG. 1, a heat-dissipating plate 30 is arranged in semiconductor device 21. Heat-dissipating plate 30 is, for example, a rectangular metal plate, having a size slightly smaller than that of the package 26 and consists of a metal possessing good thermal conductivity, such as, by way of example, copper or aluminum. Through-holes 31 are formed all over the devices surface area as shown in that figure. This feature increases the heat dissipation effects by allowing increased air flow. Turning now to FIG. 2, heat-dissipating plate 30 is equipped with two round pins 32, that have been installed downward and vertically on one of its sides. The surface of heat-dissipating plate 30 is plated with a suitable material, preferably metal, in order to prevent oxidation-caused corrosion. Such corrosion could deteriorate the heat-dissipation effect and possibly cause electrical problems or failure of the semiconductor device.

By inserting pins 32 into linking holes 28 of the package 26 and by press-fitting them into the connection holes 29 of the die pad 23, the heat-dissipating plate 30 is mechanically fastened to the semiconductor device 21 for facilitating heat transfer. As will be appreciated by those of ordinary skill in the art, the die pad is preferably made of materials possessing high heat conductivity. Accordingly, heat generated by the semiconductor element 22 is transferred to the heat-dissipating plate 30 via the die pad 23 and is then dissipated to the outside. An even better heat dissipation effect can be obtained if a device, such as, a heat sink is disposed between the semiconductor device and the corresponding circuit board when connecting semiconductor device 21 to the circuit board. Although only one semiconductor element is shown in FIGS. 1–3 for illustrative purposes only, it will be understood that two or more semiconductor elements can be mounted on die pad 23.

FIG. 3 shows lead frame 33 used in the manufacture of the semiconductor device described in the first embodiment. Lead frame 33 is produced by, for example, photo etching or press-working a thin plate made of metals, such as, Fe-Ni ahoy or copper into a specified pattern. Mounting area 34, which is slightly larger than the semiconductor element, is provided in the center of the lead frame 33 for mounting an applicable semiconductor element and is connected to and supported by external frame area 36, using the linking area 35, in its four corner areas. When mounting two or more semiconductor elements, the size of the mounting area 34 can be increased accordingly.

A large number of outer leads 27 and inner leads 24 extend from frame area 36 toward mounting area 34. Adjoining outer leads 27 are connected using internal frame 37 to prevent the encapsulating resin from escaping at the time of resin encapsulation. Two circular through-holes, i.e. connection holes 29, are formed in the remaining open area of the mounting area 34, on which semiconductor element 22 is mounted. Pilot hole 38, used for identifying or determining the position of lead frame 33, is provided in the frame area 36 of lead frame 33.

Connection holes 29, which are formed in the mounting area 34, can be increased or decreased in number as required. Furthermore, an open area in the mounting area may be provided and the connection holes 29 may be positioned appropriately, as necessitated by the design or application. In such cases, the number and locations of the pins 32 in the heat-dissipating plate 30 may be changed according to the number and locations of the connection holes. It is also possible to provide a spedfled number of connection holes 29 in mounting area 34 from the beginning, and to use only those holes that are selected based on the application and usage conditions. In this case, the linking holes 28 can be formed in correspondence to all of connection holes 29 formed in the mounting area 34, and it is also possible to form only those linking holes 28 that correspond to connection holes 29, selected based on the application and usage conditions.

In the manufacturing process of the semiconductor device in the aforementioned first embodiment, an adhesive, such as a thermosetting resin, is first used to mount the semiconductor device 21 on the mounting area 34 at a specified location, slightly offset from the connection holes 29. Next, wiring 25 is used to electrically connect each electrode of semiconductor element 22 to a corresponding inner lead 24.

Next, the lead frame 33, to which the semiconductor element and the inner leads have been connected, is held between a pair of upper and lower metal molds 40, 39 for resin encapsulation, as shown in FIG. 4. First, lead frame 33 is aligned on top of lower mold 39. Next, corresponding upper mold 40 is lowered, and lead frame 33 is held from the top and bottom, so that semiconductor element 22 and inner leads 24 are positioned inside cavity 41, defined by the two molds for injecting the resin. Upper mold 40 and lower mold 39 both comprise two pairs of retractable movable pins 42 and 43 aligned on the same axes inside the cavity 41. These movable pins 42 and 43 extend from the molds 39, 40 into cavity 41 as soon as the lead frame 33 is held between the top and bottom molds 39 and 40, and hold the mounting area 34 from the top and bottom in a position corresponding to connection holes 29. In this way, semiconductor element 22 is accurately held at the specified position inside the cavity 41. Because this arrangement allows for accurate placement of semiconductor element 22 in the center of the package, it becomes possible to make the package thinner and more compact than conventionally possible.

Next, an epoxy thermosetting resin is injected via a runner 44, through a resin injection inlet 45, filling the cavity 41. After the resin is heated and hardened, movable pins 42 and 43, which held the mounting area 34, are first extracted from the package. Tapering the tips of the movable pins 42 and 43 simplifies their extraction from the package following the formation. Next, package 26 is removed from the molds by using two injector pins, neither of which is shown in the figure. The first injector pin is used to push package 26 out and downward, while lifting the top mold 40; the second is used to push the package out from lower mold 39.

Next, internal frame 37, which connects the adjacent outer leads, is cut off. Solder plating is applied to the outer leads 26 which extend out from package 26, to the external frame area 36 of the lead frame, and to the part of the die pad 28 that is exposed to the inside of the linking holes 28 formed by the vertically movable pins 42 and 43. Then, semiconductor device 21 as shown in FIG. 1 is completed by separating outer leads 26 from frame area 36, and by forming outer leads into the desired shape. Furthermore, as needed, a product identification name or model number can be marked on the surface of package 26 using, for example, ink or laser.

Second Embodiment

The second embodiment of the present invention is shown in FIGS. 5 and 6. In the second embodiment, semiconductor element 47 is placed on die pad 48 and is encapsulated inside plastic package 49, similar to the first embodiment. However, as shown in FIG. 5, linking holes 50, that pass through package 26, are formed at the positions of inner leads 51. Connection holes 52 are formed on the part of each inner lead 51 that is exposed inside a linking hole 50. Although, the attached drawing depicts only one semiconductor element 47 mounted on the die pad 48, it is possible to mount two or more semiconductor elements, similar to the first embodiment.

A second semiconductor device 53, possessing a package structure that is independent from semiconductor device 46, is positioned on top of package 49 of the semiconductor device 46. As shown in FIG. 5, the two semiconductor devices are integrated into a single unit using, for example, a thermosetting resin. The second semiconductor device 53 possesses relatively long outer leads 54, whose tips are each inserted into the linking holes 50 of package 49, and which are press-fitted into connection holes 52 of corresponding inner leads 51. By virtue of this configuration, the second semiconductor device 53 is electrically connected to inner leads 51 of semiconductor device 46, forming a compound semiconductor device. Since, as in the second embodiment, the two semiconductor devices can easily be made into a single unit by placing the second semiconductor device 53 on top of the semiconductor device 46 and joining them, they can be combined without increasing the required assembly area when being connected to a circuit board or electronic instrument.

Furthermore, since the two semiconductor devices 46 and 53 to be joined can be tested individually for electrical performance. That is, the two semiconductors can be tested separately prior to being joined together and those components that fail such testing can be discarded prior to mounting thereto. This results in the improved overall yield of the compound semiconductor device.

Additionally, even if a failure occurs during usage, it is possible to remove and replace only the failed product. If outer leads 54 of the second semiconductor device are tapered at their tips as shown in FIG. 6, outer leads 54 can be easily and securely connected with the connection holes 52 of the inner leads 51. Tapering linking holes 50 of plastic package 49 at the bottom in correspondence to the above-mentioned tapering of outer leads 54, allows for the absorption of shock, such as vibration applied from outside to the semiconductor device. This feature ensures solid mechanical and electrical connection between the two semiconductor devices 46 and 53. Outer leads 54 of second semiconductor device 53 can share the same power supply line and grounding line with semiconductor device 46, while independent signal lines can be independently connected to inner leads 51.

FIG. 7 shows lead frame 55 that is used in the manufacture of semiconductor device 46 of the second embodiment in accordance with the present invention. In approximately the center of lead frame 55, rectangular mounting area 56 is provided that is slightly larger than the semiconductor element 47, similar to lead frame 33 in the first embodiment shown in FIG. 3. The corners of the lead frame 55 are connected to and supported by an external frame area 58, using a linking area 57. To mount two or more semiconductor elements as explained above, the size of the mounting area 56 may be appropriately increased.

A large number of outer leads 59 and inner leads 51 have been formed to extend from frame area 58 in all four directions towards mounting area 56. Outer leads 59, of which are arranged adjacent to each other, are connected together using internal frame 60. This element is used to prevent the encapsulation resin from escaping. In this embodiment, those inner leads 51 that extend from the bottom toward the mounting area 56, are made wider than other inner leads, and connection holes 52 (through-holes), as previously discussed with references to FIGS. 5 and 6, are provided in the approximate center of inner leads 51. It is also possible to provide connection holes in any of the other inner leads as necessitated by design or application in other embodiment.

The process of manufacturing the semiconductor device 46 of the second embodiment using lead frame 55 in FIG. 7 will be explained below. First, as in the case of the first embodiment, the semiconductor device 47 is mounted at the specified location in mounting area 56, and is fastened using an adhesive such as a thermosetting resin. Next, wiring 61 is used to electrically connect each electrode of the semiconductor device 47 to a corresponding inner lead 51.

Turning to FIG. 8, lead frame 55, on which semiconductor device 47 has been mounted in the manner described above, is aligned on top of lower mold 62 of a pair of metal molds that are used for resin encapsulation. Next, upper mold 63, which corresponds to the lower mold 62, is lowered from above to hold lead frame 55, so that semiconductor device 47 and inner leads 51 are held by the two molds and positioned inside which define cavity 64 for resin injection. As in the first embodiment shown in FIG. 4, the lower mold 62 and upper mold 63 both comprise multiple pairs of retractable movable pins 65 and 66 on the same axes inside cavity 64. A number of pairs of movable pins 65 and 66, equaling the number of linking holes 50 formed in the package 49, are positioned so that their axes match the center of the connection holes 52 of the corresponding inner leads 51.

The above-mentioned pairs of movable pins 65 and 66 hold corresponding inner leads 51 at the locations of their connection holes 52 from the top and bottom directions. Next, from this state, an epoxy thermosetting resin is injected via a runner 67, through a resin injection inlet 68 into cavity 64. After cavity 64 is filled, plastic package 49 is formed by heating the resin to harden it. After the injected resin is hardened, movable pins 65 and 66 are extracted from package 49. Next, injector pins in the bottom mold 62 and the top mold 63, not shown in the drawings, are used to remove the package 49 from the molds.

After internal frame 60, which connects the adjacent outer leads 59, is cut off, solder plating is applied to the outer leads 59 which extend out from package, to the frame area 58, and to the part of inner leads 51 that is exposed to the inside of the linking holes 50. Next, outer leads 59 are cut off from frame area 58, and are formed into a specified shape suitable for connection to a circuit board. In this manner, semiconductor device 46 of the second embodiment shown in FIG. 5 is obtained. As needed, a product name, model number, or manufacturer's name may be marked on the top or bottom surface of the package 49 of the semiconductor device 46, using, for example, a thermosetting ink or laser.

Third Embodiment

FIG. 9 shows a third embodiment of the present invention. In this embodiment, two semiconductor devices 69 and 70 are stacked, as was the case in the semiconductor device in the above-mentioned second embodiment. In the semiconductor device on the bottom 69, linking holes 72 have been formed in package 71, at the locations at which they align with the position of the die pad 74 on which semiconductor device 70 is mounted, as was the case in semiconductor device 21 in the first embodiment shown in FIG. 1. Through-hole type connection holes 75 have been formed in the parts of die pad 74 that are exposed inside linking holes 72. The tips of the outer leads 76 of the second semiconductor device on top 70 are press-fitted into the connection holes 75, mechanically and electrically integrating the two semiconductor devices 69 and 70. Therefore, as was the case with the semiconductor device in the above-mentioned the second embodiment shown in FIG. 5, it is possible to produce a compound semiconductor device, combining the two semiconductor devices 69 and 70 without increasing size or the required assembly area.

Fourth Embodiment

FIG. 10 illustrates a fourth embodiment of the present invention. In this embodiment, linking holes 81 and 82 have been formed in packages 79 and 80 of the two stacked semiconductor devices 77 and 78, at the locations at which they align with the positions of the die pads 85 and 86, on which semiconductor elements 83 and 84 have been mounted. Through-hole type connection holes 87 and 88 have been formed in the parts of die pads 85 and 86 that are exposed inside the linking holes 81 and 82. As shown in FIG. 10, two semiconductor devices 77 and 78 are positioned so that their linking holes 78 and 79 are aligned.

As in the case of the first embodiment, a metal heat-dissipating plate 89 possessing high heat-conductivity is positioned on top of second semiconductor device 78. A pin 90, which is vertically installed downward from the heat-dissipating plate, is inserted into two linking holes 81 and 82 in a manner that connects the two holes. Pin 90 is also press-fitted into connection holes 87 and 88 of die pads 85 and 86. This configuration allows the heat generated by semiconductor elements 83 and 84 of semiconductor devices 77 and 78 to be transferred to the pin 90 via the mounting area. As a result of this arrangement, the generated heat is then effectively dissipated from the single heat-dissipating plate 89.

The outer leads of the second semiconductor device 78 are not shown in FIG. 10. However, in other embodiments of the present invention, such as the second embodiment shown in FIG. 5, it is possible to electrically connect the two semiconductor devices, by forming linking holes that partially expose inner leads 91 of package 79 of semiconductor device 77, and by inserting the outer leads of second semiconductor device 78 into the linking holes, thus connecting them with inner leads 91. Forming compound semiconductor devices in this way enables the enhancement of the electrical performance of the semiconductor device and the addition of a heat-dissipating function.

Various embodiments of the present invention were explained above. However, it is possible to add various types of modifications and changes to the above-mentioned embodiments of the present invention within its technical scope. For example, while all of the semiconductor devices in the above embodiments are of the QFP type with leads extending out in four directions, the invention can be equally applied to other semiconductor devices possessing different lead orientation and shape, such as those of the SOP and PLCC types. Additionally, when producing a compound semiconductor device as in the second embodiment, different types of semiconductor devices can be combined and joined. Furthermore, the invention can be applied not only to resin-packaged semiconductor devices but also to ceramic-packaged semiconductor devices.

Because the invention is configured in one of the manners explained above, it provides the benefits described below.

When configured as in first embodiment, the semiconductor device of the present invention enables the connection and integration of an external structure to the semiconductor element mounting area, via linking holes formed in the package. Furthermore, the function of the semiconductor device can be enhanced by adding various types of external structures to the completed packaged semiconductor device, as necessary, thus making it possible to easily compound and enhance the overall function of the semiconductor device.

Additionally, the semiconductor device of the present invention enables connection of an external structure to the inner leads, via linking holes formed in the package. Therefore, it is possible to select, combine, and integrate an external structure, such as a separate semiconductor device, as necessitated by application and functional needs. Thus, making it possible to compound and enhance the performance of the overall semiconductor device. Furthermore, these semiconductor devices can be easily manufactured at low cost using conventional manufacturing technologies, by making only minor modifications for forming the package linking holes.

In particular, the semiconductor device of the present invention can provide a compound semiconductor device. Furthermore, when appropriate selection is made for the combination of semiconductor devices, it can provide a semiconductor device possessing the functions and configuration best suited for the application, without increasing the assembly area required; thus, offering a high level of design flexibility and high-density packaging. In addition, when a problem or failure occurs in one of the semiconductor devices, it can be easily removed and replaced, thus improving the yield of the overall semiconductor device, simplifying maintenance, and lowering costs.

Furthermore, using the semiconductor device manufacturing method described above, it is possible to form linking holes in the specified locations on the semiconductor element mounting area, and to accurately place both the semiconductor element and the mounting area in the spedfied location inside the package. This is accomplished by forming the package by injecting and hardening a resin while the mounting area, on which a semiconductor element has been mounted, is held inside a mold from the top and the bottom using a pair of movable pins. Therefore, it becomes possible to use conventional manufacturing technologies to manufacture semiconductor devices simply and at low cost, making only minor modifications for installing the movable pins in the manufacturing equipment. Furthermore, because the semiconductor device package can be made thin and small using the above-mentioned method, small sizes can be achieved for electronic instruments containing those semiconductor devices.

Moreover, by employing the manufacturing method described above, it is possible to form in the package, linking holes that reach the inner lead connection area, by forming a resin package while the connection areas of the inner leads are held inside a mold from the top and the bottom using a pair of movable pins, and by simply removing the movable pins after package formation. Therefore, it becomes possible to use conventional manufacturing technologies to manufacture semiconductor devices simply and at low cost, making only minor modifications for installing the movable pins in the manufacturing equipment.

While the invention has been described in conjunction with several specific embodiments, it is evident to those skilled in the art that many further alternatives, modifications and variations will be apparent in light of the foregoing description. Thus, the invention described herein is intended to embrace all such alternatives, modifications, applications and variations as may fall within the spirit and scope of the appended claims.

Reference Symbol

1: Semiconductor element
2: Mount
3: Inner leads
4: Wiring
5: Outer leads
6: Plastic package
7: Heat-dissipating area 8, 9: Semiconductor elements
10: Mount
11: Wiring
12: Wiring
13: Wiring
14: Inner leads
15: Outer leads
16: Plastic package
17: First semiconductor device
18: Second semiconductor device
19, 20: Outer leads
21: Semiconductor device
22: Semiconductor element
23: Die pad
24: Inner leads
25: Wire
26: Plastic package
27: Outer leads
28: Linking holes
29: Connection holes
30: Heat-dissipating plate
31: Through-holes
32: Pin
33: Lead frame
34: Mounting area
35: Linking area
36: Frame area
37: Internal frame
38: Pilot hole
39: Bottom mold
40: Top mold
41: cavity
42, 43: Movable pins
44: Runner
45: Resin injection inlet
46: Semiconductor device
47: Semiconductor element
48: Die pad
49: Plastic package
50: Linking holes
51: Inner leads
52: Connection holes
53: Second semiconductor device
54: Outer leads
55: Lead frame
56: Mounting area
57: Linking area
58: Frame area
59: Outer leads
60: Internal frame
61: Wiring
62: Bottom mold
63: Top mold
64: Cavity
65, 66: Movable pins
67: Runner
68: Resin injection inlet
69, 70: Semiconductor devices
71: Package
72: Linking hole
73: Semiconductor element
74: Die pad
75: Connection holes
76: Outer leads
77, 78: Semiconductor devices
79, 80: Packages
81, 82: Linking holes
83, 84: Semiconductor elements
85, 86: Die pads
87, 88: Connection holes
89: Heat-dissipating plate
90: Pin
91: Inner leads

What is claimed is:

1. A semiconductor device comprising:

at least one semiconductor element arranged on a semiconductor element mounting area, said semiconductor element mounting area comprising a connection area for connecting to an external structure;

inner and outer leads electrically connected to said semiconductor element; and a package encapsulating said semiconductor element and said inner leads, said package comprising linking holes leading to said connection area of said semiconductor element mounting area.

2. The semiconductor device in claim 1, wherein said connection area of said semiconductor element mounting area comprises through-holes formed on said semiconductor element mounting area.

3. The semiconductor device in claim 1, said external structure comprises a heat-dissipating device.

4. A semiconductor device comprising:

at least one semiconductor element arranged on a semiconductor element mounting area;

inner and outer leads electrically connected to said semiconductor element, said inner leads comprising connection areas for electrically connecting to an external structure; and a package encapsulating said semiconductor element and said inner leads, said package comprising linking holes leading from an exterior surface to said connection areas of said inner leads.

5. The semiconductor device in claim 4, wherein said connection areas of said inner leads comprises through-holes formed on said inner leads.

6. A semiconductor device comprising:

a first semiconductor device having at least a first semiconductor element;

first inner and first outer leads electrically connected to the first semiconductor element, said first inner leads comprising first connection areas that lead to an outside structure;

a first package encapsulating said at least one semiconductor element and said first inner leads, said first package comprising first linking holes leading from an exterior surface to said first connection areas of said first inner leads;

a second semiconductor device comprising of at least a second semiconductor element a second inner and second outer leads electrically connected to said second semiconductor element; and a second package encapsulating said second semiconductor element and said second inner leads, wherein said second outer leads of said second semiconductor device are connected to said first connection areas of said first semiconductor device through said first linking holes of said first package of the first semiconductor device.

7. A semiconductor device comprising:

a mounting element having at least one through-hole;

a semiconductor arranged on said mounting element;

an encapsulating member for encapsulating said semiconductor and said mounting element having an opening in alignment with said through-hole;

an external member arranged extending through said opening and said through-hole, said external member being in mechanical contact with said through hole and having a portion arranged on the exterior of said encapsulating member.

8. A semiconductor device comprising:

a mounting element;

a first semiconductor element arranged on said mounting element;

a first plurality of wirings electrically connected to said first semiconductor element;

a second plurality of wirings;

an encapsulating member for encapsulating said first semiconductor device, said mounting element and first portions of each of said first and second plurality of wirings, another portion of each of said first and second plurality of wiring extending outside of said encapsulating member through an opening;

a second semiconductor element disposed on said encapsulating member; and at least one connecting member electrically connected to said second semiconductor element and passing through said opening and electrically connected to corresponding ones of said second wirings.

9. A semiconductor device comprising:

a first mounting element having a first through-hole;

a first semiconductor element arranged on said first mounting element;

a first encapsulating member for encapsulating said first semiconductor element and said first mounting element having a first opening in alignment with said first through-hole;

a second mounting element having a second through-hole in alignment with said first opening and said first through-hole;

a second semiconductor element arranged on said second mounting element;

a second encapsulating member arranged on said first encapsulating member for encapsulating said second semiconductor element and said second mounting element having a second opening in alignment with said first and second through-holes and said first opening; and an external member arranged extending through said first and second openings and said first and second through-holes, said external member being in mechanical contact with said first and second through-holes.

10. The semiconductor device in claim 1, said external structure comprises another semiconductor element.

11. The semiconductor device in claim 4, said external structure comprises another semiconductor element.

12. The semiconductor device in claim 9, said external member comprises a heat-dissipating device.

* * * * *